United States Patent
Aoyama et al.

(10) Patent No.: US 11,841,467 B2
(45) Date of Patent: Dec. 12, 2023

(54) SEMICONDUCTOR DEVICE, PHOTOELECTRIC CONVERSION DEVICE, PHOTOELECTRIC CONVERSION SYSTEM, TRANSPORT APPARATUS, AND CONTROL METHOD OF SEMICONDUCTOR DEVICE

(71) Applicant: Canon Kabushiki Kaisha, Tokyo (JP)

(72) Inventors: Eiki Aoyama, Saitama (JP); Takuya Minakawa, Toyko (JP)

(73) Assignee: Canon Kabushiki Kaisha, Tokyo (JP)

( * ) Notice: Subject to any disclaimer, the term of this patent is extended or adjusted under 35 U.S.C. 154(b) by 286 days.

(21) Appl. No.: 17/178,716

(22) Filed: Feb. 18, 2021

(65) Prior Publication Data

US 2021/0255292 A1  Aug. 19, 2021

(30) Foreign Application Priority Data

Feb. 19, 2020 (JP) .................................. 2020-026468
Nov. 19, 2020 (JP) .................................. 2020-192667

(51) Int. Cl.
*H03K 17/00* (2006.01)
*G01S 7/497* (2006.01)

(52) U.S. Cl.
CPC .............. *G01S 7/497* (2013.01); *H03K 17/00* (2013.01)

(58) Field of Classification Search
CPC ..................................................... H03K 17/00
USPC ......................................................... 327/365
See application file for complete search history.

(56) References Cited

U.S. PATENT DOCUMENTS

| 8,847,675 | B2 * | 9/2014 | Minakawa | H03K 19/0016 |
| | | | | 327/540 |
| 9,054,699 | B2 * | 6/2015 | Iwama | H03K 17/18 |
| 9,455,715 | B2 | 9/2016 | Pedersen et al. | |
| 9,746,501 | B1 * | 8/2017 | Chang | H01L 27/092 |
| 10,033,388 | B1 * | 7/2018 | Rawat | H03K 19/17736 |
| 10,642,329 | B2 * | 5/2020 | Park | G06F 1/266 |
| 11,043,837 | B2 * | 6/2021 | Liu | H02H 3/28 |
| 11,139,652 | B2 * | 10/2021 | Cutcher | H02J 7/0063 |
| 11,295,787 | B1 * | 4/2022 | Gunther | G11C 5/147 |
| 11,329,504 | B1 * | 5/2022 | Miloslavskiy | H03K 21/02 |
| 2013/0002287 | A1 * | 1/2013 | Pedersen | H03K 19/17764 |
| | | | | 327/365 |
| 2021/0255292 | A1 * | 8/2021 | Aoyama | H04N 25/79 |
| 2022/0276692 | A1 * | 9/2022 | Thibaut | G06F 1/305 |
| 2023/0099606 | A1 * | 3/2023 | Peting | H03F 1/025 |
| | | | | 330/10 |

FOREIGN PATENT DOCUMENTS

| JP | 2007104846 A | 4/2007 |
| JP | 2009164730 A | 7/2009 |
| JP | 2013017171 A | 1/2013 |
| JP | 5408362 B2 | 2/2014 |
| WO | 2012056574 | 5/2012 |

* cited by examiner

*Primary Examiner* — Ryan Jager
(74) *Attorney, Agent, or Firm* — Venable LLP

(57) ABSTRACT

A semiconductor device comprising an integrated circuit is provided. The integrated circuit comprises a first element configured to execute a predetermined operation, a second element, and a controller configured to perform control of setting the second element in a non-operation state in a case in which performance deterioration of the first element is a first degree and operating the second element in a case in which the performance deterioration of the first element is a second degree larger than the first degree.

17 Claims, 12 Drawing Sheets

SEMICONDUCTOR DEVICE, PHOTOELECTRIC CONVERSION DEVICE, PHOTOELECTRIC CONVERSION SYSTEM, TRANSPORT APPARATUS, AND CONTROL METHOD OF SEMICONDUCTOR DEVICE

BACKGROUND OF THE INVENTION

Field of the Invention

The present invention relates to a semiconductor device, a photoelectric conversion device, a photoelectric conversion system, a transport apparatus, and a control method of the semiconductor device.

Description of the Related Art

A semiconductor device is incorporated and used in a monitoring camera required to operate for a long time or an in-vehicle camera required to have high reliability. To ensure the long-time operation or high reliability of the semiconductor device, a configuration for making an integrated circuit included in the semiconductor device redundant has been examined. International Publication No. 2012/056574 shows including a plurality of semiconductor devices having the same configuration to increase the redundancy. In International Publication No. 2012/056574, if the magnitude relation between a predetermined threshold and a value obtained by measuring the physical characteristic of an active semiconductor circuit during the operation of the semiconductor circuit reverses, current carrying to the active semiconductor circuit is stopped, and the semiconductor circuit to be used is switched, thereby operating the system for a long time.

SUMMARY OF THE INVENTION

It is necessary to operate a semiconductor device for a longer time while ensuring higher reliability.

Some embodiments of the present invention provide a technique advantageous in ensuring a long-time operation and high reliability of a semiconductor device.

According to some embodiments, a semiconductor device comprising an integrated circuit, wherein the integrated circuit comprises: a first element configured to execute a predetermined operation; a second element; and a controller configured to perform control of setting the second element in a non-operation state in a case in which performance deterioration of the first element is a first degree and operating the second element in a case in which the performance deterioration of the first element is a second degree larger than the first degree, is provided.

According to some other embodiments, a semiconductor device comprising an integrated circuit, wherein the integrated circuit comprises: a first element configured to execute a predetermined operation; a second element; and a controller configured to perform control of operating the second element in a case in which a deterioration signal representing performance deterioration of the first element is received and setting the second element in a non-operation state in a case in which the deterioration signal is not received, is provided.

According to still other embodiments, a control method of a semiconductor device comprising an integrated circuit including a first element configured to execute a predetermined operation, and a second element, comprising: performing control of setting the second element in a non-operation state in a case in which performance deterioration of the first element is a first degree; and operating the second element in a case in which the performance deterioration of the first element is a second degree larger than the first degree.

Further features of the present invention will become apparent from the following description of exemplary embodiments (with reference to the attached drawings).

DESCRIPTION OF THE EMBODIMENTS

Figure 1:
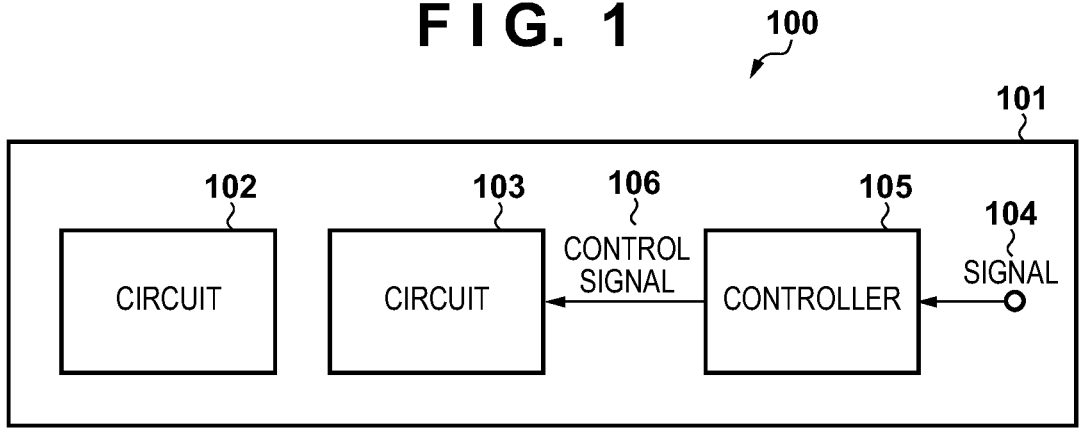
FIG. 1 is a block diagram showing an example of the configuration of a semiconductor device according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

The configuration and operation of a semiconductor device according to an embodiment of the present invention will be described with reference to FIGS. 1 to 13. FIG. 1 is a block diagram showing an example of the configuration of a semiconductor device 100 according to this embodiment.

The semiconductor device 100 includes an integrated circuit 101. The integrated circuit 101 includes a circuit 102 including an element configured to execute a predetermined operation, a circuit 103 having the same configuration as the circuit 102, and a controller 105 that controls an element including the circuit 103 based on a signal 104 (deterioration signal) representing deterioration of the performance of the element including the circuit 102 during an operation. The circuit 102 is a circuit that operates in a normal state independently of the degree of performance deterioration such as a temporal change (for example, degradation) caused by use of the semiconductor device 100. The element included in the circuit 103 is in a non-operation state until the degree of performance deterioration of the element included in the circuit 102 for a predetermined operation becomes a predetermined degree. On the other hand, if it is difficult for the element included in the circuit 102 to execute the predetermined operation due to a temporal change or the like, in other words, the performance deterioration is larger than a predetermined degree, the element included in the circuit 103 operates under the control of the controller 105. That is, the circuit 102 is a redundancy target circuit in the semiconductor device 100, and the circuit 103 is a redundant circuit arranged to ensure the redundancy of the circuit 102. A description will be made below assuming that the element included in the circuit 103 operates to ensure the redundancy of the circuit 102 in accordance with characteristic degradation (performance deterioration) of the element included in the circuit 102 caused by a temporal change or the like.

The controller 105 is notified of the state of the circuit 102 by the signal 104 (deterioration signal). In accordance with the signal 104, the controller 105 selects an element to be operated in the circuit 103 via a control signal 106. For example, concerning the circuit 102 including an element whose performance has deteriorated, the circuit 102 and the element selected in the circuit 103 by the controller 105 operate, thereby executing the predetermined operation to be performed by the circuit 102. As will be described later, the signal 104 may be generated in the integrated circuit 101, or may be supplied from the outside of the integrated circuit 101. In addition, the controller 105 may control the state of the circuit 102 by the signal 104 and another signal. The "another signal" is a signal (normal signal) representing that the performance deterioration of the circuit 102 has not reached a predetermined degree. That is, if the performance deterioration of the element included in the circuit 102 has not reached a predetermined degree, a normal signal is generated. The normal signal is a signal representing that the performance deterioration of the element included in the circuit 102 is smaller than that in a case in which a deterioration signal is generated. If the controller 105 receives the normal signal, the predetermined operation by the circuit 102 is continued. On the other hand, if the signal 104 is received, the controller 105 may select an element to be operated in the circuit 103.

Figure 2:
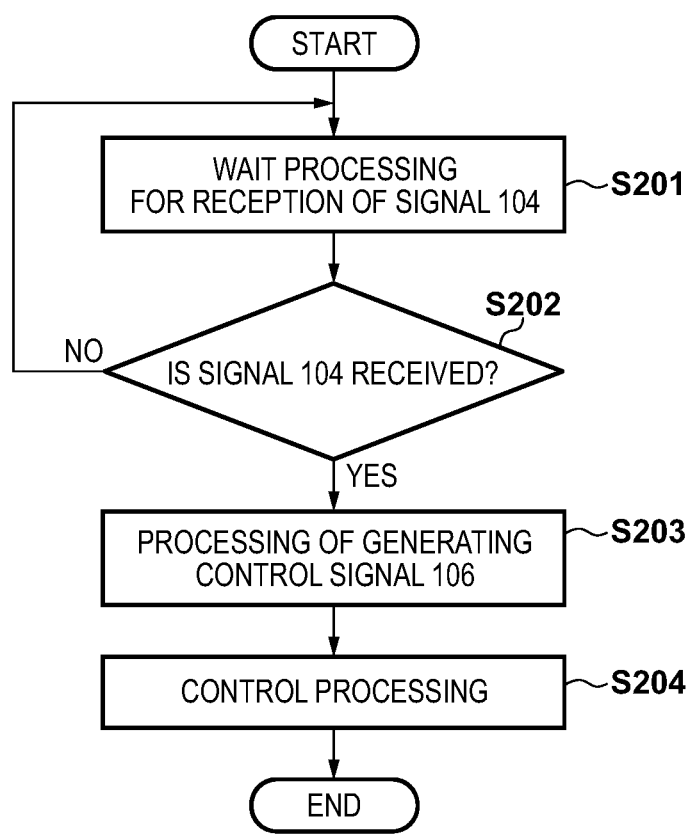
FIG. 2 is a flowchart showing an example of the operation of the semiconductor device shown in FIG. 1.

Details of the operation of the integrated circuit 101 will be described next. FIG. 2 is a flowchart for explaining the operation of the integrated circuit 101 of the semiconductor device 100 shown in FIG. 1.

When the operation is started by, for example, powering on the device, the controller 105 repetitively performs reception wait processing (step S201) and determination of the presence/absence of reception of the signal 104 (step S202) to receive the signal 104. The detailed form of the signal 104 does not matter, and, for example, the signal 104 may be a binary signal that takes high level when the performance of the element included in the circuit 102 has deteriorated, and takes low level otherwise. Alternatively, for example, the signal 104 may be a multi-valued signal having a plurality of bits corresponding to the degrees of progress of performance deterioration of the element included in the circuit 102.

Upon receiving the signal 104, the controller 105 executes processing (step S203) of generating the control signal 106 used to select an element to be operated in the circuit 103. The detailed form of the control signal 106 does not matter. For example, if the signal 104 is a binary signal as described above, the control signal 106 may be a binary signal that changes to high level when an element included in the circuit 103 is used, and changes to low level when an element included in the circuit 103 is not used. In this case, all elements arranged in the circuit 103 can change to a selection state and operate. Also, for example, each of the circuits 102 and 103 may be formed by one element.

Concerning the control signal 106, a case in which the signal 104 is a multi-valued signal as described above will be examined. In this case, a storage unit that stores the multi-valued control signal 106 corresponding to the multi-valued signal 104 may be arranged in the controller 105, and the controller 105 may select the control signal 106 according to the multi-valued signal 104 from the storage unit and supply it to the circuit 103. The controller 105 may include a logic operation circuit capable of generating the multi-valued control signal 106 corresponding to the multi-valued signal 104. The controller 105 can thus generate the multi-valued control signal 106 corresponding to the multi-valued signal 104.

Next, the controller 105 executes control processing (step S204) of controlling the element included in the circuit 103 by supplying the control signal 106 to the circuit 103. If the control signal 106 is a binary signal, control in two states can be performed such that the circuit 103 is operated in addition to the circuit 102, or the circuit 103 is not operated. If the control signal 106 is a multi-valued signal, the types and number of elements to be operated in the circuit 103 can appropriately be selected in accordance with each signal.

Figure 3:
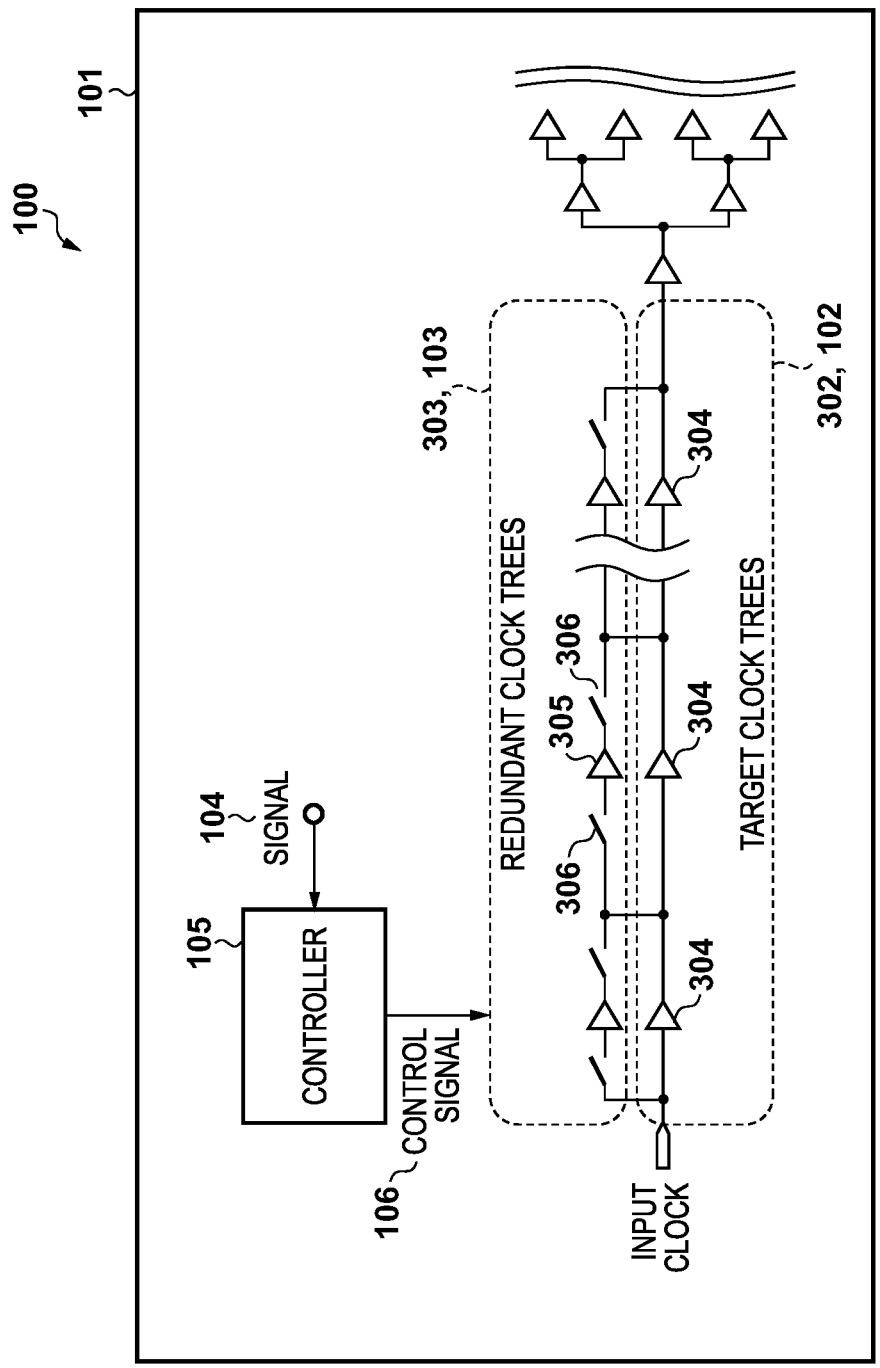
FIG. 3 is a block diagram in a case in which the semiconductor device shown in FIG. 1 is applied to a clock tree.

FIG. 3 shows a case in which this embodiment is applied to a circuit that forms a clock tree as the circuit 102 of the semiconductor device 100. In general, when current carrying to the integrated circuit 101 of the semiconductor device 100 is performed, a phenomenon called NBTI (Negative Bias Temperature Instability) or hot carrier injection occurs. It is known that this causes an element degradation phenomenon that changes the threshold voltage or ON current of a transistor. It is difficult to make a design to satisfy a desired product life in consideration of the degradation of the threshold voltage or ON current of a transistor caused by current carrying.

One cause of making it difficult to make a design to satisfy a desired product life is a fault in a circuit operation caused by the degradation of a clock buffer that forms a clock tree in a synchronization circuit. In a synchronization circuit design, a clock tree is formed to supply a clock signal to a flip-flop circuit in the circuit. In the synchronization circuit, the toggle rate of the clock signal propagated by the clock tree is higher as compared to a circuit that propagates another data signal, and the progress of degradation caused by hot carrier injection can be faster than that of the circuit that propagates the data signal. Since the degradation progresses quickly, a normal clock signal cannot be propagated to the flip-flop circuit in the synchronization circuit, and an operation error of the synchronization circuit may occur.

According to this embodiment, even if degradation occurs in a clock buffer that is an element arranged the circuit 102 as the redundancy target, a clock buffer that is an element arranged in the circuit 103 for redundancy is used in combination. This makes it possible to supply a normal clock signal to the flip-flop circuit in the integrated circuit 101 of the semiconductor device 100. A detailed operation will be described below with reference to FIG. 3.

The integrated circuit 101 of the semiconductor device 100 includes a clock tree 302 that is an example of the circuit 102 that is the redundancy target and operates in a normal state, and a clock tree 303 that is an example of the circuit 103 used to make the clock tree 302 redundant. The clock tree 302 includes a clock buffer 304. The clock tree 303 includes a clock buffer 305 configured to function as a clock buffer in place of the clock buffer 304 if the performance of the clock buffer 304 that is an element included in the clock tree 302 has deteriorated, and a clock buffer control switch 306.

The controller 105 supplies the control signal 106 to the clock tree 303 in accordance with the signal 104 representing the performance deterioration of the clock buffer 304 included in the clock tree 302 that is an example of the circuit 102. By the control signal 106, the clock buffer control switch 306 in the clock tree 303 is controlled, and the clock buffer 305 to be used for the operation is selected. Hence, the clock buffer 304 and the clock buffer 305 can be used in parallel, and even if the degree of performance deterioration becomes large in the clock buffer 304 of the clock tree 302, clock propagation similar to that before the performance deterioration of the clock buffer 304 can be performed.

In the configuration shown in FIG. 3, only one line of clock tree 303 configured to ensure redundancy is arranged. However, a plurality of lines of clock trees 303 may be arranged. When a plurality of lines of clock trees 303 are arranged, and the clock buffer 304 and a plurality of clock buffers 305 are used in parallel, a clock can be propagated in the integrated circuit 101 for a longer period even if degradation occurs in the clock buffer 304.

A case in which a power shutdown function arranged in the semiconductor device 100 is the redundancy target will be described next with reference to FIG. 4. The power shutdown function is a technique aiming at suppressing a leakage current by stopping power supply to some circuits (regions) that need not operate in the integrated circuit 101 of the semiconductor device 100.

In a power shutdown switch 404 that controls power supply, a voltage that sets the power shutdown switch 404 always in an ON state is applied to the gate during a non-power shutdown (power supply) period. If the power shutdown switch 404 is formed by a PMOS switch, a negative bias is always applied to the gate during the non-power shutdown period, and degradation by NBTI occurs. As a result, the amount of a current that the power shutdown switch 404 can supply can temporally change in accordance with use of the semiconductor device 100. The change of the current amount causes a change of time until power feed to a power shutdown region 406 is completed.

If the ON current of the power shutdown switch 404 becomes small, the power feed time for the power shutdown region 406 becomes long. When the power feed time becomes long, the time until the power shutdown region 406 recovers becomes long. If recovery is not completed at a desired timing, an operation error of the power shutdown region 406 occurs.

It is also considered that the ON current of the power shutdown switch 404 becomes large, and the power feed time for the power shutdown region becomes short. If the ON current of the power shutdown switch 404 becomes large due to the occurrence of degradation in the power shutdown switch 404, the amount of a current flowing to the power shutdown region 406 in a unit time becomes large when changing from a power shutdown state to a power supply state. When the amount of the current flowing to the power shutdown region 406 in a unit time becomes large, power supply noise that changes the potential of a non-power shutdown region 410 may be generated. If the power supply noise is generated, an operation error may occur in the non-power shutdown region 410.

According to this embodiment, even if degradation occurs in the power shutdown switch 404 that is an element arranged the circuit 102 as the redundancy target, the power shutdown switch that is an element arranged in the circuit 103 for redundancy is used in combination. This makes it possible to execute the power shutdown function while suppressing an occurrence of a fault in the circuit operation. A detailed operation will be described below with reference to FIG. 4.

The integrated circuit 101 of the semiconductor device 100 includes a power shutdown switch group 402 that is an example of the circuit 102 that is the redundancy target and operates in a normal state, and a power shutdown switch group 403 that is an example of the circuit 103 used to make the power shutdown switch group 402 redundant. The power shutdown switch group 402 is formed by one or a plurality of power shutdown switches 404. The power shutdown switch group 403 is formed by one or a plurality of power shutdown switches 405. Power supply to the power shutdown region 406 is controlled by the power shutdown switches 404 and 405.

The controller 105 supplies the control signal 106 to the power shutdown switch group 403 in accordance with the signal 104 representing the performance deterioration of the power shutdown switch 404 included in the power shutdown switch group 402 that is an example of the circuit 102. By the control signal 106, the power shutdown switch 405 that is an element to be operated in the power shutdown switch group 403 is selected. Hence, the power shutdown switch 404 and the power shutdown switch 405 can be used in combination, and even if degradation occurs in the power shutdown switch 404 of the power shutdown switch group 402, the power feed time for the power shutdown region 406 can be controlled.

An example in which the semiconductor device 100 is applied to a photoelectric conversion device 501 will be described next with reference to FIG. 5. Another example of the cause of making it difficult to make a design to satisfy a desired product life is a fault in a circuit operation caused by performance deterioration of an element included in a driving circuit configured to drive a photoelectric conversion unit in which a plurality of pixels each including a photoelectric conversion element are arranged in photoelectric conversion device. The photoelectric conversion device 501 performs image capturing by converting incident light into an electrical signal by the photoelectric conversion elements. If a driving circuit that generates a driving signal for the photoelectric conversion unit temporally degrades, the driving signal generation timing temporally changes. As a result, the operation timing when performing image capturing such as photoelectric conversion changes, and a fault that image capturing at a desired timing is impossible may occur.

According to this embodiment, even if degradation occurs in a driving circuit 511 that is the circuit 102 as the redundancy target, a driving circuit 512 that is the circuit 103 for redundancy is used in combination. This enables a circuit operation at an appropriate timing in the photoelectric conversion device 501. A detailed operation will be described below with reference to FIG. 5.

Figure 5:
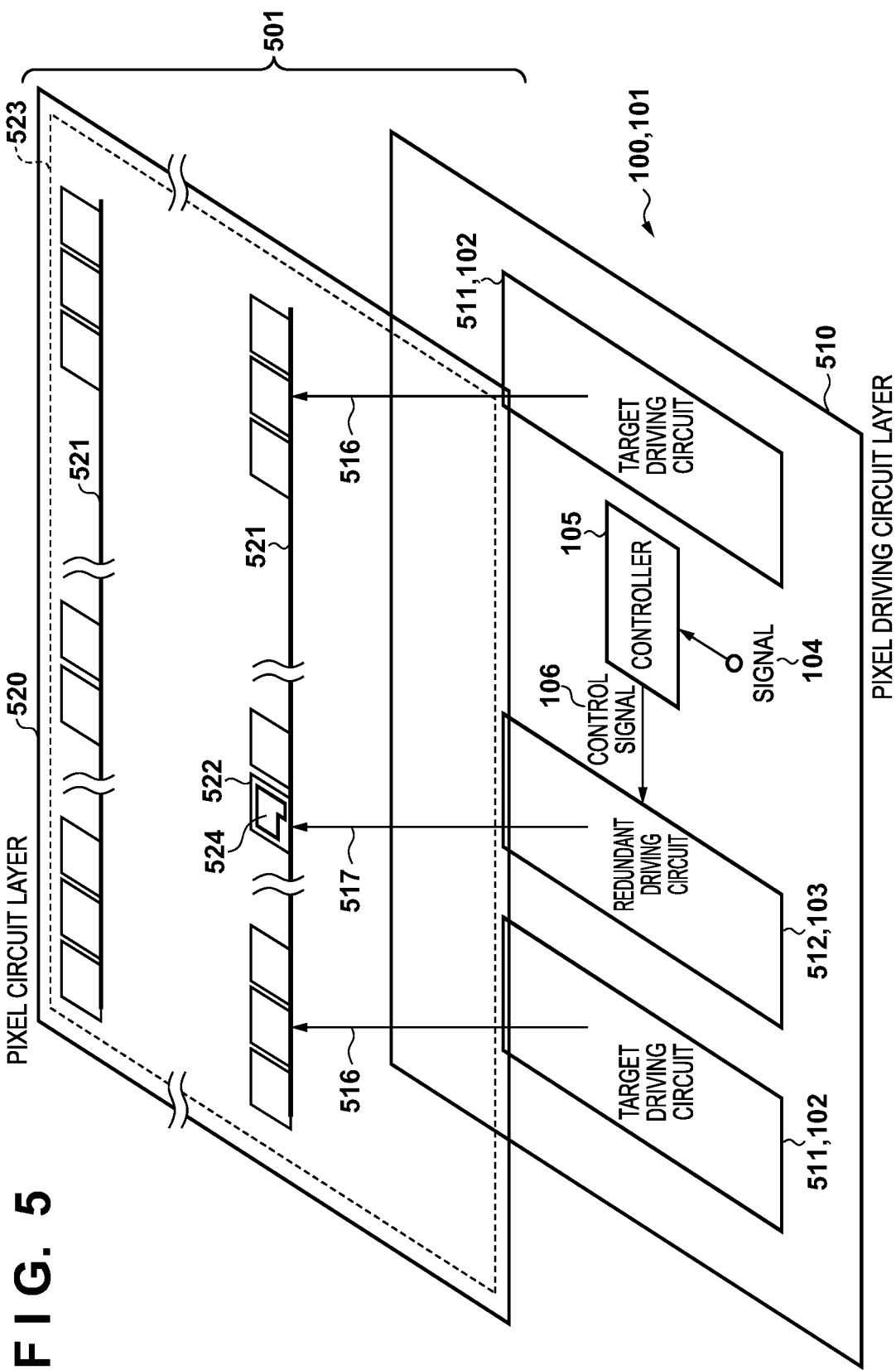
FIG. 5 is a block diagram in a case in which the semiconductor device shown in FIG. 1 is applied to the driving circuit of a photoelectric conversion device.

The photoelectric conversion device 501 shown in FIG. 5 includes a pixel circuit layer 520 including a photoelectric conversion unit 523 in which pixels 522 each including a photoelectric conversion element 524 are arranged in an array, and a pixel driving circuit layer 510 that supplies a driving signal 516 to the pixel circuit layer 520. The pixel driving circuit layer 510 is an example of a layer including the integrated circuit 101 of the above-described semiconductor device 100. The pixel driving circuit layer 510 includes the driving circuit 511 that is an example of the circuit 102 as the redundancy target, and the driving circuit 512 that is an example of the circuit 103 used to make the driving circuit 511 redundant. In the configuration shown in FIG. 5, the photoelectric conversion device 501 has a stacked structure including the pixel circuit layer 520 with the photoelectric conversion unit 523, and the pixel driving circuit layer 510 with the integrated circuit 101. However, the structure is not limited to this, and the photoelectric conversion unit 523 and the integrated circuit 101 including the driving circuit 512 may be arranged in the same layer.

In the pixel circuit layer 520, the pixels 522 arranged in an array are connected to the driving circuit 511 by a driving signal line 521 shared by the pixels 522 arranged in the lateral direction (to be also referred to as a row direction or a horizontal direction) shown in FIG. 5. The pixels 522 connected to the common driving signal line 521 are controlled by the driving signal 516 output from the driving circuit 511. By the driving signal 516, the timing of driving is transmitted to the pixels 522 in the pixel circuit layer 520, and an electrical (charge) signal generated by the photoelectric conversion element 524 can be read.

In this embodiment, since the configuration of a process after the pixels 522 convert light into an electrical signal does not matter, it is expressed as the "pixel driving circuit layer 510", and a method of processing the electrical signal output from each pixel 522 in the pixel circuit layer 520 is not described. As the processing of the electrical signal output from the pixel 522, various kinds of known processing can be applied.

Every time the electrical signal is output from the pixel 522, the driving circuit 511 that outputs the driving signal 516 temporally degrades, and the timing of output of the driving signal 516 from the driving circuit 511 temporally changes. The temporal change changes the timing of reading the electrical signal from the pixel 522. Hence, when the driving circuit 511 and the driving circuit 512 that makes the driving circuit 511 redundant are used in combination, the timing of reading the electrical signal from the pixel 522 can be adjusted.

More specifically, the controller 105 supplies the control signal 106 to the driving circuit 512 in accordance with the signal 104 representing the performance deterioration of the driving circuit 511 that is an example of the circuit 102. By the control signal 106, the driving circuit 512 that outputs a driving signal 517 is selected. Hence, the driving signal line 521 is driven using the driving signal 516 supplied from the driving circuit 511 and the driving signal 517 supplied from the driving circuit 512. The driving circuit 512 is controlled by the control signal 106 output from the controller 105, and the control timing may be controlled by the signal 104. Alternatively, the control timing of the driving circuit 512 may be controlled by a control circuit (not shown) configured to drive the driving circuit 511. The control timings of the driving circuit 511 and the driving circuit 512 may be controlled by the same control circuit (for example, the controller 105).

Figure 6:
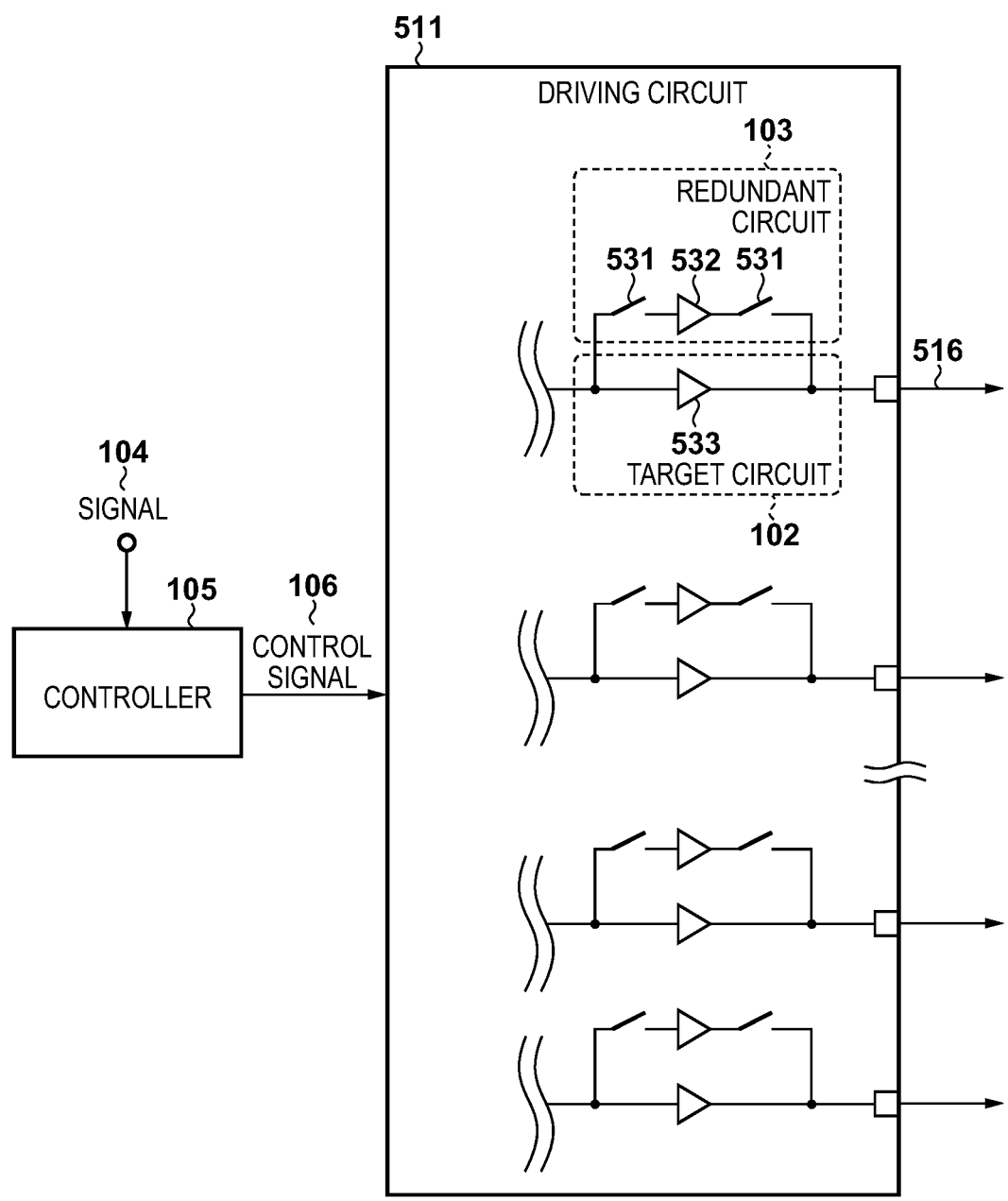
FIG. 6 is a block diagram in a case in which the semiconductor device shown in FIG. 1 is applied to the driving circuit of a photoelectric conversion device.

In the above description, the driving circuit 511 is made redundant. As shown in FIG. 6, the circuit may be made redundant in the driving circuit 511. More specifically, an output buffer circuit 533 that finally outputs the driving signal 516 from the driving circuit 511 is set to the redundancy target, and the driving signal 516 may be output by combining a buffer circuit 532 that is an element included in the circuit 103. The operation of the buffer circuit 532 is controlled by a buffer circuit control switch 531, and the buffer circuit control switch 531 is controlled by the control signal 106 supplied from the controller 105. This makes it possible to control the output timing of the driving signal 516 even if the output buffer circuit 533 degrades.

In the above description, the driving circuits 511 and 512 are shown as the examples of the circuits 102 and 103 in the photoelectric conversion device 501. However, the present invention is not limited to this. For example, in the pixel driving circuit layer 510 of the photoelectric conversion device 501, the combination of the above-described clock trees 302 and 303 may be arranged, or the combination of the power shutdown switch groups 402 and 403 may be arranged. The integrated circuit 101 of the semiconductor device 100 can be applied to various configurations of the photoelectric conversion device 501.

Additionally, in this embodiment, an image capturing device has been described as an example of the photoelectric conversion device 501 to which the semiconductor device 100 is applied. However, the present invention is not limited to this, and the semiconductor device can also be applied to another example of the photoelectric conversion device. For example, the semiconductor device 100 can be applied to a photoelectric conversion device such as a distance measuring device (a device configured to measure a distance using focus detection or TOF (Time Of Flight)) or a photometric device (a device configured to measure an incident light amount).

Figure 7:
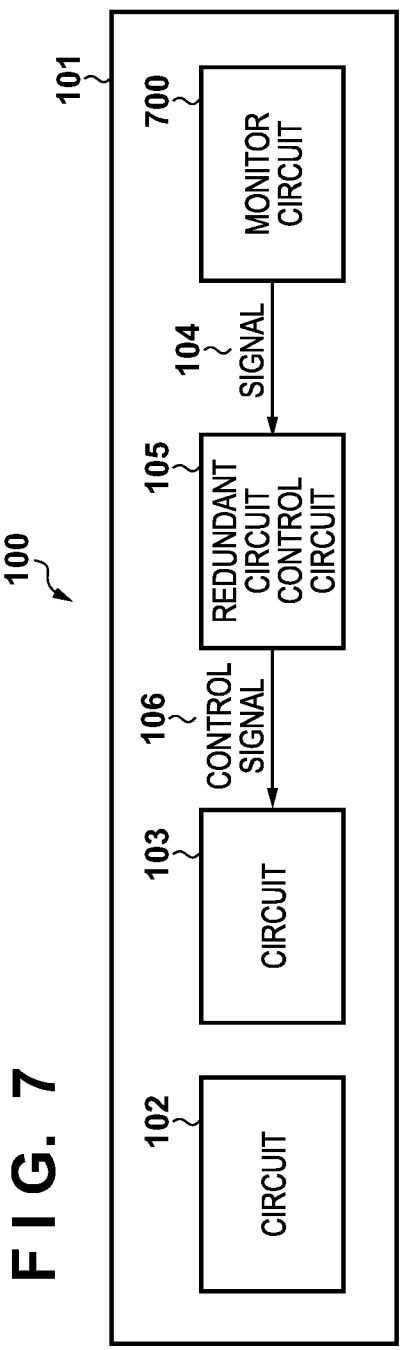
FIG. 7 is a block diagram showing a modification of the semiconductor device shown in FIG. 1.

Generation of the signal 104 representing the state of an element included in the circuit 102 during an operation will be described next. FIG. 7 is a block diagram of the semiconductor device 100 in a case in which the signal 104 is generated in the integrated circuit 101. In the configuration shown in FIG. 7, the integrated circuit 101 further includes a monitor circuit 700 configured to monitor the state of the element included in the circuit 102 in addition the configuration shown in FIG. 1 described above. The monitor circuit 700 generates the signal 104 in accordance with the degree of performance deterioration of the element included in the circuit 102, and supplies the signal 104 to the controller 105.

Figure 8:
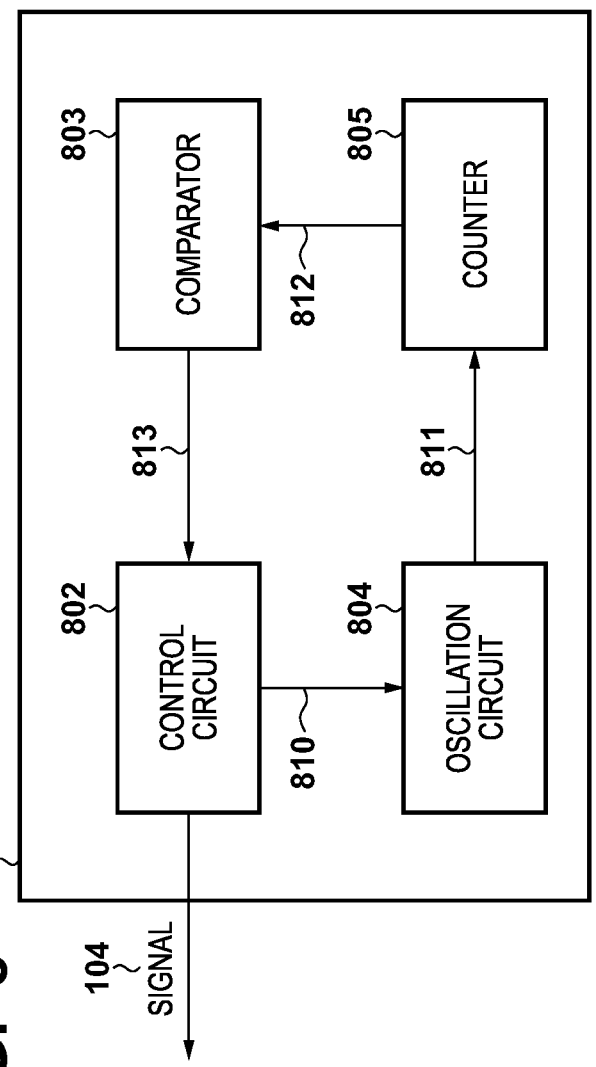
FIG. 8 is a block diagram showing an example of the configuration of the monitor circuit of the semiconductor device shown in FIG. 7.

As circuit configuration of the monitor circuit 700, various known circuit configurations can be used. FIG. 8 is a block diagram showing an example of the circuit configuration of the monitor circuit 700. The operation of the monitor circuit 700 will be described below.

In the configuration shown in FIG. 8, the monitor circuit 700 includes an oscillation circuit 804, and generates the signal 104 in accordance with a change of the oscillation frequency of the oscillation circuit 804. Also, the monitor circuit 700 includes a control circuit 802, a comparator 803, and a counter 805.

As the oscillation circuit 804, for example, a ring oscillator circuit formed by multistage connection of an odd number of inverters may be used. When a transistor that forms the oscillation circuit 804 repeats switching, degradation occurs in the transistor that forms the oscillation circuit 804, a change of the ON current or a change of a threshold voltage occurs, and the oscillation frequency changes. This allows the monitor circuit 700 to monitor (estimate) the state of the element included in the circuit 102.

Figure 9:
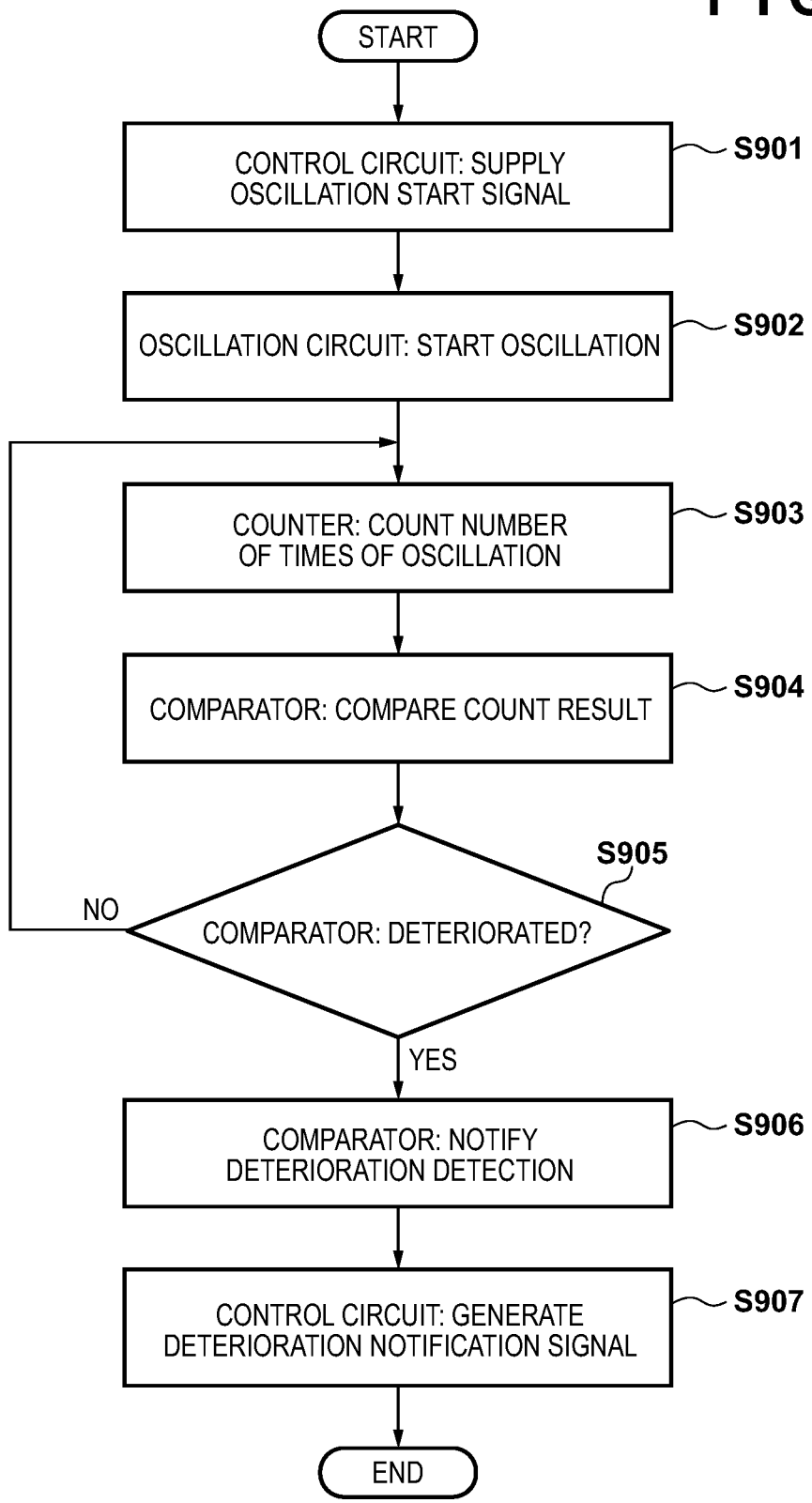
FIG. 9 is a flowchart showing an example of the operation of the monitor circuit shown in FIG. 8.

FIG. 9 is a flowchart showing an example of the operation of the monitor circuit 700 to generate the signal 104 and supply it to the controller 105. First, the control circuit 802 configured to control the operation of the monitor circuit 700 performs oscillation start notification processing (step S901) of supplying an oscillation start signal 810 to the oscillation circuit 804. In accordance with the oscillation start signal 810, the oscillation circuit 804 performs oscillation start processing (step S902) of starting oscillation.

When the oscillation circuit 804 starts oscillation, the counter 805 performs count processing (step S903) of counting the number of times of oscillation of an oscillation signal 811 output from the oscillation circuit 804. The counter 805 notifies the comparator 803 of a count result 812.

The comparator 803 stores, in advance, a value (to be referred to as a relationship value hereinafter) of the oscillation frequency of the oscillation circuit 804 according to the relationship between the state of the element included in the circuit 102 and the oscillation frequency (the number of times of oscillation) of the oscillation circuit 804. The comparator 803 performs count result comparison processing (step S904) of comparing the relationship value with the count result 812.

The comparator 803 determines (step S905) the state (the degree of performance deterioration) of the element included in the circuit 102 based on the result of the count result comparison processing. As the result of count result comparison determination, if the count does not reach a count representing that the performance deterioration of the circuit 102 is a predetermined degree, as compared to the relationship value (NO in step S905), the process advances to count processing (step S903). If the count reaches a count representing that the performance deterioration of the circuit 102 is larger than the predetermined degree, as compared to the relationship value (YES in step S905), the comparator 803 executes degradation detection notification processing (step S906) of supplying a degradation detection notification signal 813 to the control circuit 802. Upon receiving the degradation detection notification signal 813, the control circuit 802 executes signal generation processing (step S907) of generating the signal 104.

Here, if the relationship value is one value, the signal 104 can be the above-described binary signal. If two or more values (for example, a value A and a value B) are provided as the relationship values, the signal 104 can be a multi-valued signal including a signal according to a count smaller than the value A, a signal according to a count ranging from the value A (inclusive) to the value B (exclusive), and a signal according to a count equal to or larger than the value B.

The physical arrangement of the monitor circuit 700 in the integrated circuit 101 will be described next with reference to FIG. 10. Generally, in the integrated circuit 101, a gradient of the voltage or temperature of a power supply occurs depending on physical coordinate positions. The magnitude of the degradation of an element such as a transistor included in the circuit 102 changes depending on a condition such as a voltage or a temperature. Hence, when the condition such as a voltage or a temperature for the monitor circuit 700 is made close to that of the circuit 102 as the redundancy target, the monitor circuit 700 can more correctly detect the state of the element included in the circuit 102.

Figure 10:
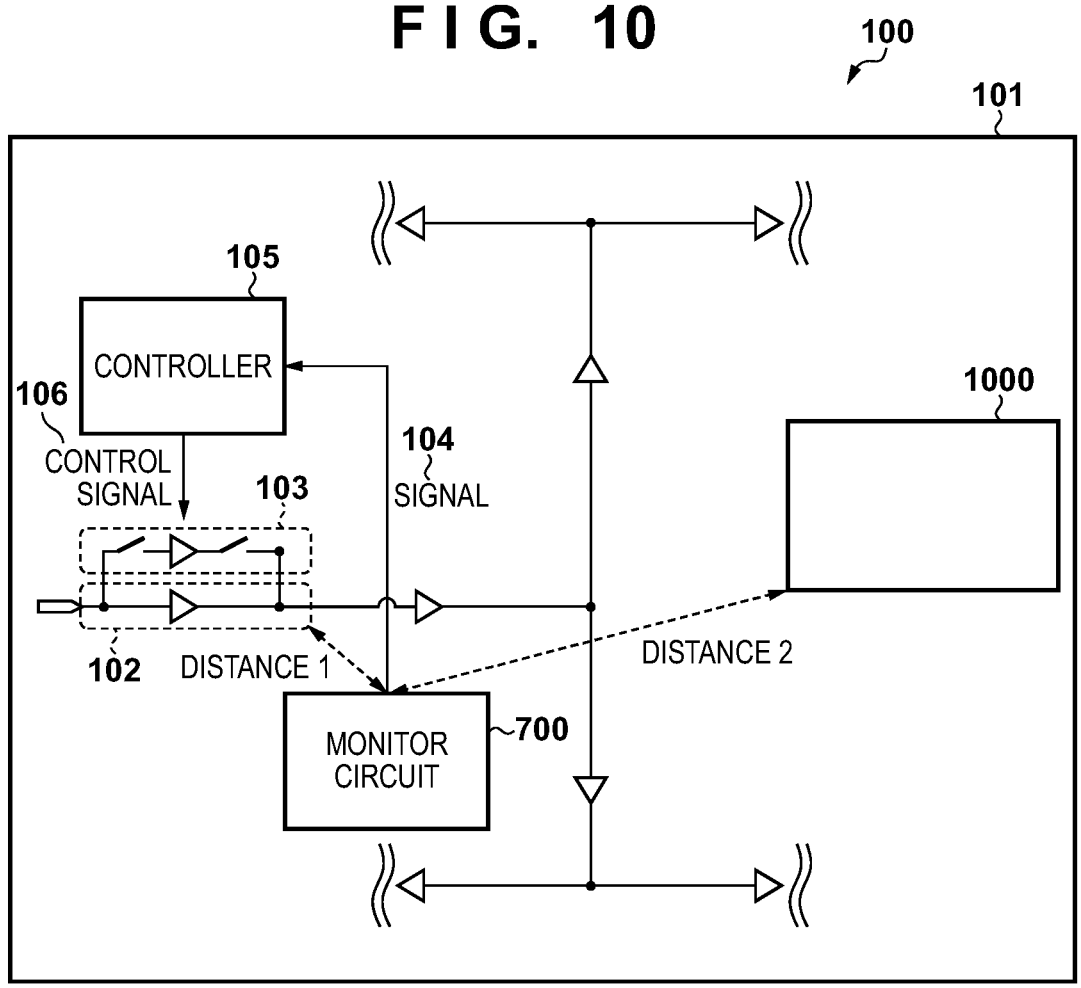
FIG. 10 is a block diagram showing an example of the arrangement of the monitor circuit of the semiconductor device shown in FIG. 8.

As shown in FIG. 10, consider a case in which the integrated circuit 101 further includes a circuit 1000 configured to execute an operation different from a predetermined operation executed by the element included in the circuit 102. Depending on the power consumption of the circuit 1000 different from the circuit 102, a voltage supplied to an element arranged on the periphery of the circuit 1000 may be different from that on the periphery of the circuit 102. The temperature on the periphery of the circuit 102 and the temperature on the periphery of the circuit 1000 may also be different. For this reason, if the distance between the circuit 1000 and the monitor circuit 700 becomes short, the condition such as a voltage or a temperature in the monitor circuit 700 may be greatly different from the condition such as a voltage or a temperature in the circuit 102 and may be close to the condition such as a voltage or a temperature in the circuit 1000. That is, the monitor circuit 700 may be unable to correctly monitor the state of the element included in the circuit 102.

Hence, the monitor circuit 700 is arranged such that distance 2 between the monitor circuit 700 and the element included in the circuit 1000 becomes longer than distance 1 between the monitor circuit 700 and the element included in the circuit 102, as shown in FIG. 10. Since the condition such as a voltage or a temperature in the monitor circuit 700 and that in the element included in the circuit 102 thus become close, the monitor circuit 700 can more correctly monitor the state of the element included in the circuit 102.

The arrangement of each constituent element of the integrated circuit 101 may be adjusted such that, for example, the circuit 1000 is arranged in a region other than the region between the monitor circuit 700 and the element included in the circuit 102. Alternatively, for example, the monitor circuit 700 may be arranged to be adjacent to the circuit 102. When the monitor circuit 700 is arranged to be adjacent to the circuit 102, the condition such as a voltage or a temperature can be almost equal between the element included in the circuit 102 and the element included in the monitor circuit 700.

Figure 11:
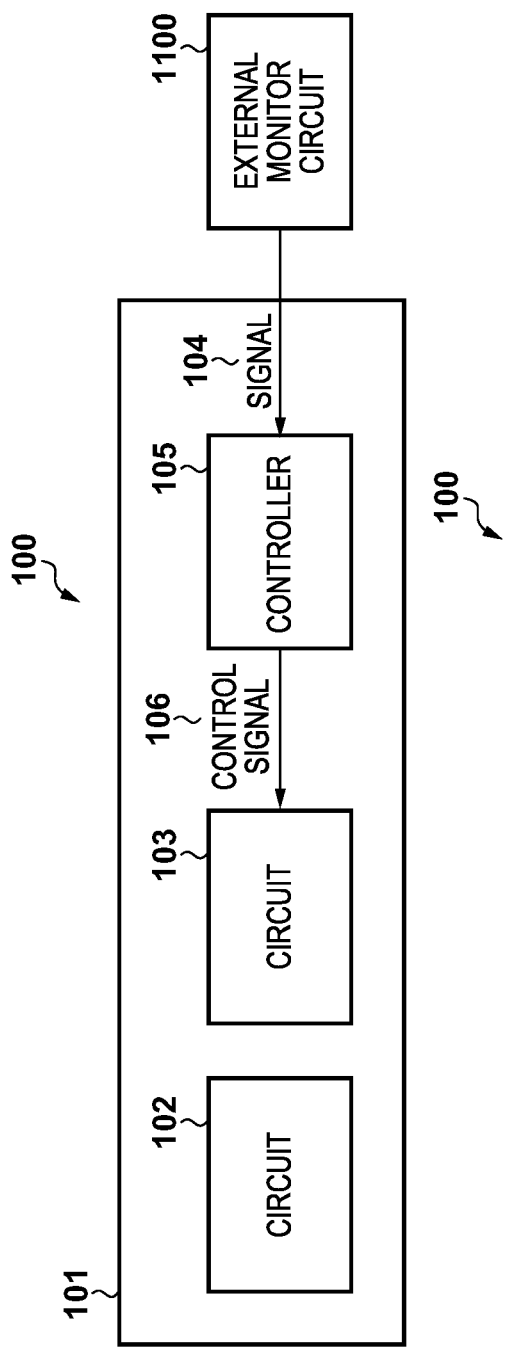
FIG. 11 is a block diagram showing another modification of the semiconductor device shown in FIG. 1.

Arranging the monitor circuit 700 configured to monitor the element included in the circuit 102 in the integrated circuit 101 in the configuration shown in FIG. 7 has been described. However, the circuit configured to monitor the circuit 102 need not always be arranged in the integrated circuit 101. As shown in FIG. 11, the semiconductor device 100 may further include an external monitor circuit 1100 configured to monitor the state of the element included in the circuit 102 separately from the integrated circuit 101. The external monitor circuit 1100 generates the signal 104 in accordance with the degree of performance deterioration of the element included in the circuit 102, and supplies the signal 104 from the outside of the integrated circuit 101 to the controller 105 in the integrated circuit 101. The external monitor circuit 1100 monitors a state such as the magnitude of the degree of degradation of the element included in the circuit 102 from the outside of the integrated circuit 101, and generates the signal 104.

Various kinds of appropriate methods can be used to monitor the element included in the circuit 102. For example, the external monitor circuit 1100 may have the same configuration as the above-described monitor circuit 700 and operate under an operation condition that is the same as or close to that of the circuit 102. It is possible to monitor the degree of performance deterioration of the element included in the circuit 102 based on the information of oscillation information measured by an oscillation circuit arranged in the external monitor circuit 1100, and supply the signal 104 to the controller 105.

Also, for example, the external monitor circuit 1100 may monitor operation conditions such as the temperature, the operating voltage, the total current-carrying time, and/or the toggle rate of the element included in the circuit 102. According to the result of monitoring at least one of the operation conditions of the circuit 102, the external monitor circuit 1100 may obtain the state of performance deterioration such as degradation of the element included in the circuit 102 and supply the signal 104 to the controller 105. The external monitor circuit 1100 may calculate the state of the element included in the circuit 102 based on the monitor results of the operation conditions of the circuit 102 and generate the signal 104. The external monitor circuit 1100 may generate the signal 104 by referring to, for example, a lookup table recorded in advance and representing the relationship between the operation conditions and the degree of performance deterioration of the circuit 102.

Figure 12:
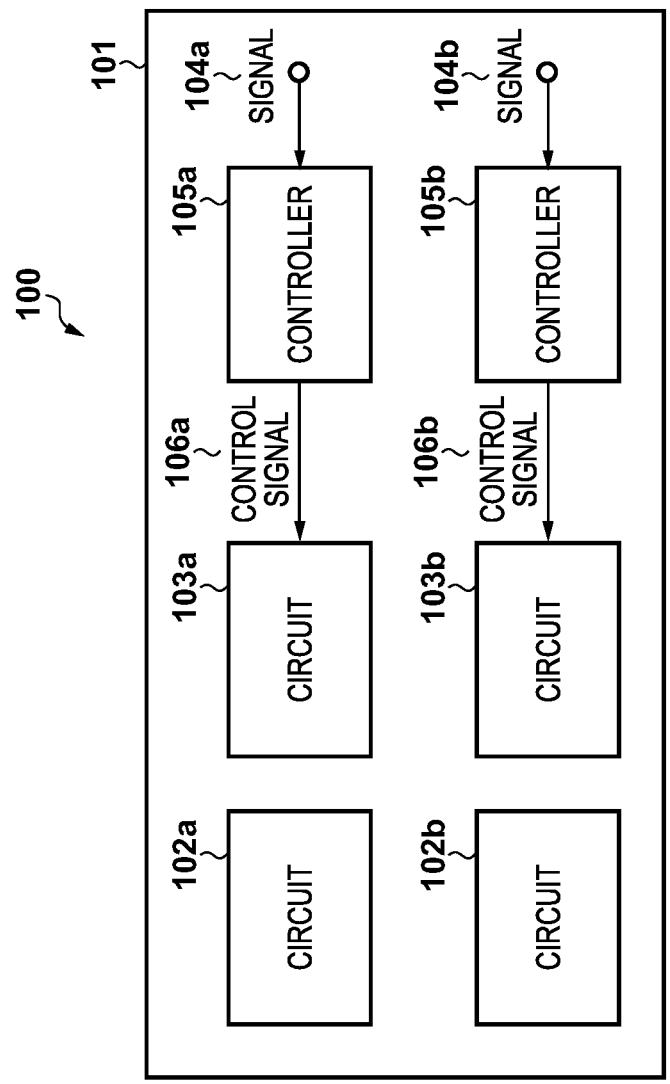
FIG. 12 is a block diagram showing still another modification of the semiconductor device shown in FIG. 1.

In the above-described embodiment, a case in which one set of the circuit 102 including an element that is a redundancy target, the circuit 103 including an element that makes the circuit 102 redundant, and the controller 105 that controls the circuit 103 is included in the integrated circuit 101 is shown. However, the combination of the circuits 102 and 103 and the controller 105 included in the integrated circuit 101 is not limited to one set, and a plurality of sets may be arranged in the integrated circuit 101. A configuration shown in FIG. 12 shows an example of the integrated circuit 101 including two sets of circuits 102 and 103 and the controllers 105. FIG. 12 shows an example of a configuration including two sets of circuits 102 and 103 and the controllers 105. However, the integrated circuit 101 may include three or more sets of the above-described combinations.

A circuit 102*a*, a circuit 103*a*, and a controller 105*a* shown in FIG. 12 function as one set to execute a predetermined operation. Similarly, a circuit 102*b*, a circuit 103*b*, and a controller 105*b* function as one set to execute a predetermined operation. Signals 104*a* and 104*b* representing a state such as performance deterioration of elements included in the circuits 102*a* and 102*b* during an operation may be supplied to the controllers 105*a* and 105*b* by the monitor circuit 700 arranged in the integrated circuit 101, as described above.

Figure 13:
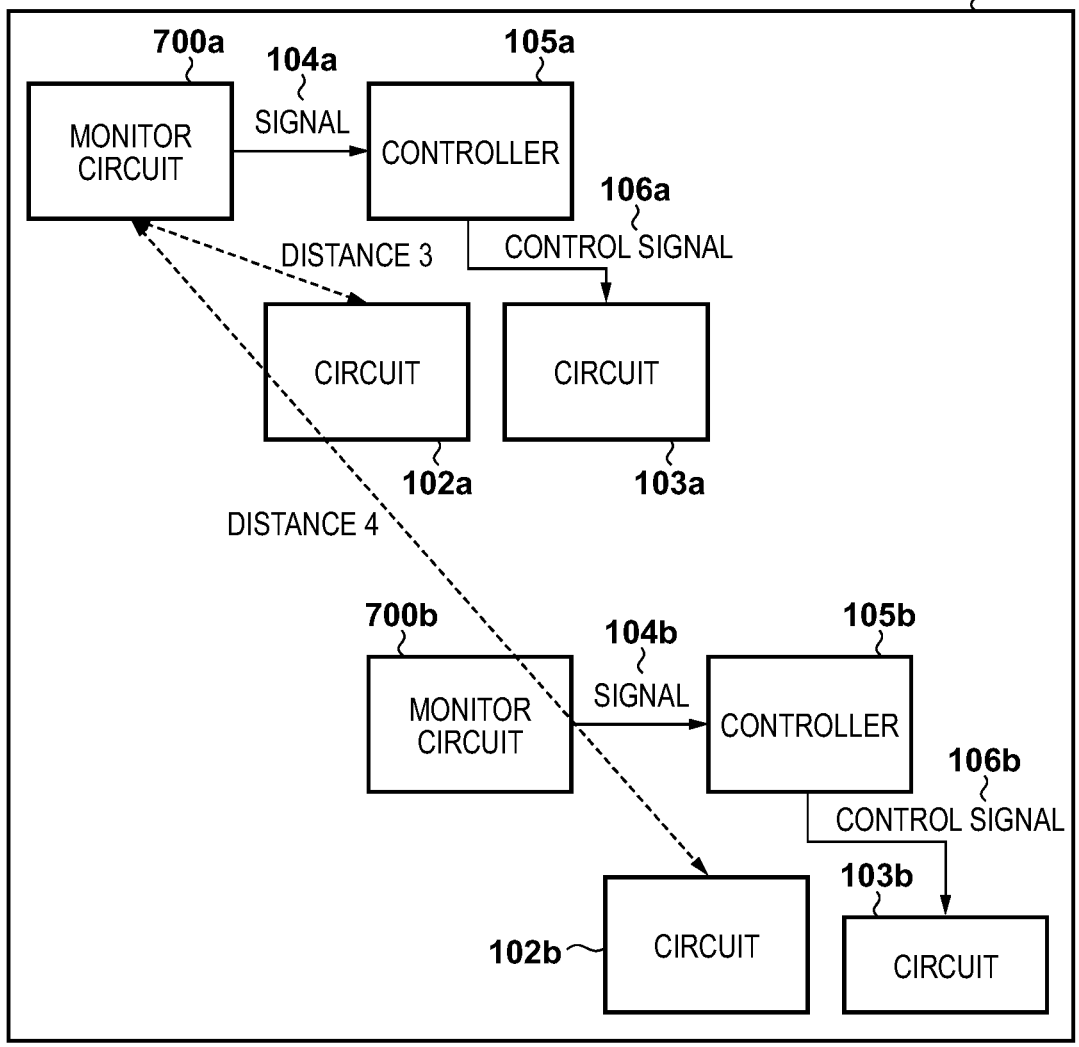
FIG. 13 is a block diagram showing an example of the arrangement of the monitor circuit of the semiconductor device shown in FIG. 12.

FIG. 13 is a block diagram in a case in which the signals 104*a* and 104*b* are generated by the monitor circuit 700 arranged in the integrated circuit 101 in the configuration shown in FIG. 12. The monitor circuit 700 may be a circuit common to the circuits 102*a* and 102*b* as the redundancy targets. However, as described above, the possibility that the monitor circuit 700 can correctly detect the degree of performance deterioration such as degradation of the elements included in the circuits 102*a* and 102*b* is high when the condition such as a voltage or a temperature at the time of an operation for the monitor circuit 700 is close to that of the circuits 102*a* and 102*b*. Hence, in the configuration shown in FIG. 13, a monitor circuit 700*a* and a monitor circuit 700*b* are arranged in the integrated circuit 101. The monitor circuit 700*a* monitors the state of the circuit 102*a*, generates the signal 104*a* in accordance with the degree of performance deterioration of the element included in the circuit 102*a*, and supplies the signal 104*a* to the controller 105*a*. Similarly, the monitor circuit 700*b* monitors the state of the circuit 102*b*, generates the signal 104*b* in accordance with the degree of performance deterioration of the element included in the circuit 102*b*, and supplies the signal 104*b* to the controller 105*b*.

The physical arrangement of the monitor circuit 700*a* in the integrated circuit 101 will be described here. As described above, in the integrated circuit 101, a gradient of the voltage or temperature of a power supply occurs depending on physical coordinate positions. The magnitude of the degradation of an element such as a transistor included in the circuit 102*a* changes depending on a condition such as a voltage or a temperature. Hence, when the condition such as a voltage or a temperature for the monitor circuit 700*a* is made close to that of the circuit 102*a* as the redundancy target, the monitor circuit 700*a* can more correctly detect the state of the element included in the circuit 102*a*.

Hence, distance 3 between the monitor circuit 700*a* and the element included in the circuit 102*a* may be shorter than distance 4 between the monitor circuit 700*a* and the element included in the circuit 102*b*. When distance 3 is shorter than distance 4, the conditions such as temperatures or voltages applied to the monitor circuit 700*a* and the element included in the circuit 102*a* are closer than the conditions for the monitor circuit 700*a* and the circuit 102*b*. Hence, the monitor circuit 700*a* can more correctly detect the state of the element included in the circuit 102*a*. As for the physical arrangement of the circuit 102*b* and the monitor circuit 700*b* that monitors the state of the circuit 102*b* as well, when these are arranged like the circuit 102*a* and the monitor circuit 700*a*, the monitor circuit 700*b* can more correctly detect the state of the element included in the circuit 102*b*. For example, the monitor circuit 700*a* may be adjacently arranged to be adjacent to the circuit 102*a*, and the monitor circuit 700*b* may be similarly adjacently arranged to be adjacent to the circuit 102*b*.

In the configurations shown in FIGS. 12 and 13, the controllers 105*a* and 105*b* configured to control the circuits 103*a* and 103*b* are separately arranged. However, the present invention is not limited to this. One controller 105 may be arranged in the integrated circuit 101, and the controller 105 may control the element included in the circuit 103*a* in accordance with the signal 104*a* and control the element included in the circuit 103*b* in accordance with the signal 104*b*.

The signals 104*a* and 104*b* may be supplied to the controllers 105*a* and 105*b* by the external monitor circuit 1100 arranged separately from the integrated circuit 101, as described above. At this time, the external monitor circuit 1100 may be a combination of an external monitor circuit corresponding to the circuit 102*a* and an external monitor circuit corresponding to the circuit 102*b*. The external monitor circuit 1100 may be a circuit in which a circuit corresponding to the circuit 102*a* and a circuit corresponding to the circuit 102*b* are put into one. The external monitor circuit 1100 can have any configuration if the signals 104*a* and 104*b* corresponding to the states of the circuits 102*a* and 102*b* can be generated.

Another modification of the above-described embodiment will be described here. For example, the signal 104 used to notify the state of the circuit 102 shown in FIG. 1 can be replaced with another signal inside the integrated circuit 101. The other signal can be, for example, a signal representing the total current-carrying time of the integrated circuit 101 itself, a signal representing a temperature, a signal representing an operation mode, or the like. For example, the other signal may be a signal representing the state of a circuit (element) different from the circuit 102 arranged in the integrated circuit 101 separately from the above-described monitor circuit 700, for example, a signal representing the total current-carrying time of the circuit, a signal representing a temperature, a signal representing an operation mode, or the like. The circuit may be a circuit configured to execute the same operation as the circuit 102, or may be a circuit configured to execute a different operation. The state of the circuit 102 can be predicted not only from the signal 104 representing the state of the circuit 102 but also from these signals representing the state of the integrated circuit 101. In other words, these signals different from the signal 104 can be signals (deterioration signals) representing the degree of performance deterioration of the circuit 102. Hence, the controller 105 may perform the determination of step S202 in FIG. 2 using the signal representing the state of the integrated circuit 101 in place of the signal 104 or using both the signal 104 representing the state of the circuit 102 and the signal representing the state of the integrated circuit 101.

Similarly, the external monitor circuit 1100 shown in FIG. 11 may be replaced with another circuit arranged in the semiconductor device 100, which is associated with the information of operation conditions such as the temperature, the operating voltage, the total current-carrying time, and the toggle rate of the element included in the circuit 102. In some cases, a circuit associated with these pieces of information exists in the semiconductor device 100. Hence, the internal signal of the circuit associated with the information of the state of the circuit 102 can be used in place of the signal 104. Also, for example, in the configuration shown in FIG. 12, the signals 104a and 104b can be replaced with other signals of a circuit associated with the information of the state of the circuit 102 arranged in the integrated circuit 101. The other signals can be, for example, signals of a circuit different from the circuit 102, which represent information associated with the total current-carrying time, the temperature, the operation mode, and the like of the circuit 102.

Also, in the configuration shown in FIG. 3, only one line of clock tree 303 configured to ensure redundancy is arranged. However, a plurality of lines of clock trees 303 may be arranged, as described above. In this case, the number of clock trees 303 to be used in parallel may be controlled in accordance with the magnitude of degradation of the clock tree 302. When controlling the number of clock trees 303 to be used in parallel, the signal 104 is a multi-valued signal, and the control signal 106 supplied from the controller 105 to the clock tree 303 based on the signal 104 is a multi-valued signal as well. This makes it possible to change (control) the number of clock trees 303 to be used in parallel.

Figure 4:
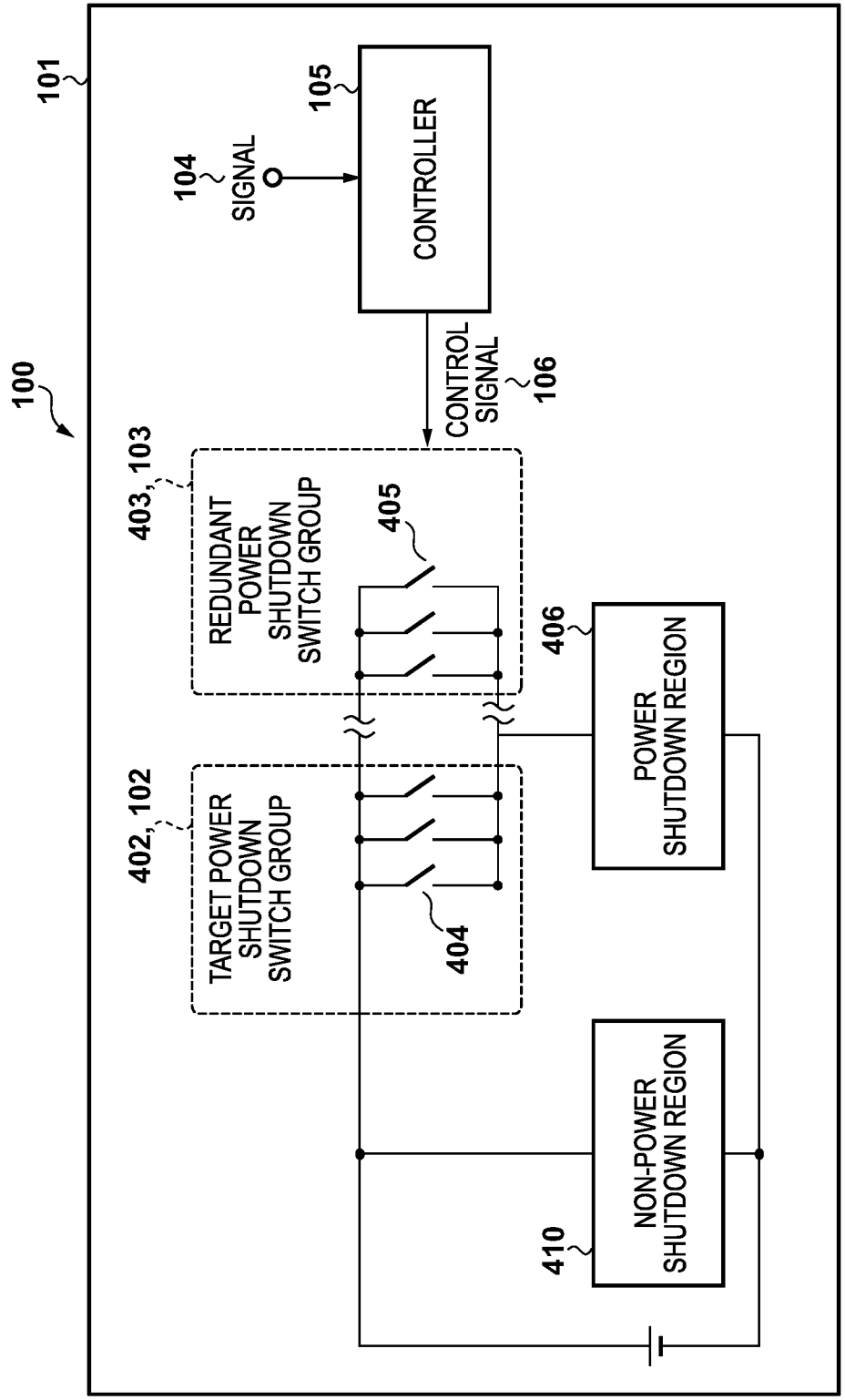
FIG. 4 is a block diagram in a case in which the semiconductor device shown in FIG. 1 is applied to a power shutdown switch.

Similarly, in the configuration shown in FIG. 4, the controller 105 may control the number of power shutdown switches 405 that tare included in the power shutdown switch group 403 and are to be operated in parallel in accordance with the state (performance deterioration) of the power shutdown switch group 402. In this case, the signal 104 output in accordance with performance deterioration is a multi-valued signal, and the control signal 106 supplied from the controller 105 to the power shutdown switch group 403 based on the multi-valued signal 104 is a multi-valued signal. This makes it possible to change (control) the number of power shutdown switches 405 to be used in parallel. In addition, a plurality of power shutdown switch groups 403 may be arranged, and the number of power shutdown switch groups 403 or the number of power shutdown switches 405 to be operated in parallel with the power shutdown switch group 402 may be changed.

Also, in the configuration shown in FIG. 5, a plurality of driving circuits 512 may be arranged, and the controller 105 may control the number of driving circuits 512 to be operated in parallel in accordance with the state (performance deterioration) of the driving circuit 511. In this case, the signal 104 output in accordance with performance deterioration is a multi-valued signal, and the control signal 106 supplied from the controller 105 to the driving circuit 512 based on the multi-valued signal 104 is a multi-valued signal. This makes it possible to change (control) the number of driving circuits 512 to be used in parallel.

Furthermore, the semiconductor device 100 may be configured to operate in a plurality of operation modes. That is, in some cases, the integrated circuit 101 may switch a plurality of operation modes different from each other and operate in each operation mode. For this reason, the operation of the integrated circuit 101 of the semiconductor device 100 shown in FIG. 2 may be executed not only at the time of power-on but also, for example, every time the operation mode of the integrated circuit 101 is switched. This is because the speed and amount of performance deterioration of the circuit 102 and the type of circuit 103 to be operated for redundancy may change depending on the operation mode in which the integrated circuit 101 operates.

As for the switching of the operation mode, for example, a case in which the integrated circuit 101 is operated in two operation modes including a power saving mode and a high-speed signal processing mode in redundancy of the clock tree shown in FIG. 3 can be considered. The high-speed signal processing mode can be a mode used to improve the processing capability of the integrated circuit 101 as compared to the power saving mode by making the power supply voltage higher than in the power saving mode and raising the clock frequency. In the high-speed signal processing mode, the performance deterioration of the clock tree 302 may be larger than in the power saving mode. Also, in the high-speed signal processing mode, signal processing faster than in the power saving mode is required. Hence, the number of circuits to be operated for redundancy may change, more specifically, increase. In other words, there can be cases in which a plurality of clock trees 303 are arranged in parallel, and more clock trees 303 are operated in the high-speed signal processing mode than in the power saving mode, thereby performing faster signal processing. Hence, the procedure shown in FIG. 2 may be executed when switching the operation mode of the integrated circuit 101.

Figure 14:
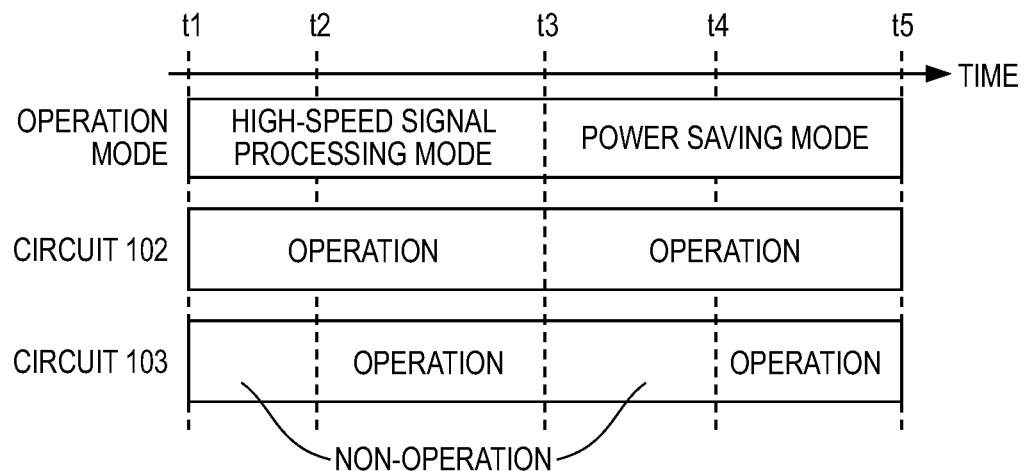
FIG. 14 is a timing chart showing an example of the operation at the time of switching of the operation mode of the semiconductor device shown in FIG. 1.

FIG. 14 is a timing chart showing an example of the operations of the circuits 102 and 103 when switching the operation mode of the integrated circuit 101 from the high-speed signal processing mode to the power saving mode. The circuit 102 always continues the operation, as described above. On the other hand, the circuit 103 may start the operation at the timing to be described below in the power saving mode and the high-speed signal processing mode.

As shown in FIG. 14, the circuit 103 is at stop (non-operation) at time t1 when the operation is started in the high-speed signal processing mode. Next, at time t2, the circuit 103 receives the control signal 106 from the controller 105 and starts the operation. At time t3, when the operation mode of the integrated circuit 101 switches to the power saving mode, the controller 105 transmits the control signal 106 for setting the circuit 103 in the non-operation state to the circuit 103, and the circuit 103 stops the operation in accordance with the control signal 106 and transitions to the non-operation state. Next, at time t4, the circuit 103 receives the control signal 106 from the controller 105 and starts the operation. As shown in FIG. 14, the time from time t1 when the integrated circuit 101 starts the operation in the high-speed signal processing mode to time t2 when the circuit 103 starts the operation can be shorter than the time from time t3 when the operation mode switches, and the integrated circuit 101 starts the operation in the power saving mode to time t4 when the circuit 103 starts the operation.

Also, as shown in FIG. 14, since the circuit 103 is set in the non-operation state every time the operation mode is switched, and operates at the timing when the performance of the circuit 102 as the redundancy target deteriorates, and the operation of the circuit 103 is necessary, the time of the operation shortens. This can suppress performance deterioration of the circuit 103 configured to make the circuit 102 redundant. In addition, since the circuit 103 does not operate during the period from time t1 to time t2 and during the period from time t3 to time t4, for example, a recovery effect for degradation caused by NBTI is generated, and the degradation of the circuit 103 can recover. For this reason, when the circuit 103 is operated at a timing appropriate for each operation mode of the integrated circuit 101, the operation of the integrated circuit 101 can be guaranteed for a longer period, and the reliable semiconductor device 100 can be implemented.

The high-speed signal processing mode can correspond to, for example, a high resolution mode in which data of a large number of pixels is processed by a data processing circuit of a photoelectric conversion system such as a camera. The power saving mode can correspond to a live view mode in which image capturing data is displayed on a viewfinder or a display by a data processing circuit of a photoelectric conversion system such as a camera. If the image capturing mode is switched in a photoelectric conversion system such as a camera, for example, the frequency of a clock to be supplied is changed without changing the operating voltage in some cases. In this case as well, when the operation mode is switched, the above-described operation is performed, thereby operating the circuit 103 arranged to make the circuit 102 redundant only during a necessary period. This makes it possible to ensure high reliability for a long time in the semiconductor device 100 including the integrated circuit 101.

Figure 15:
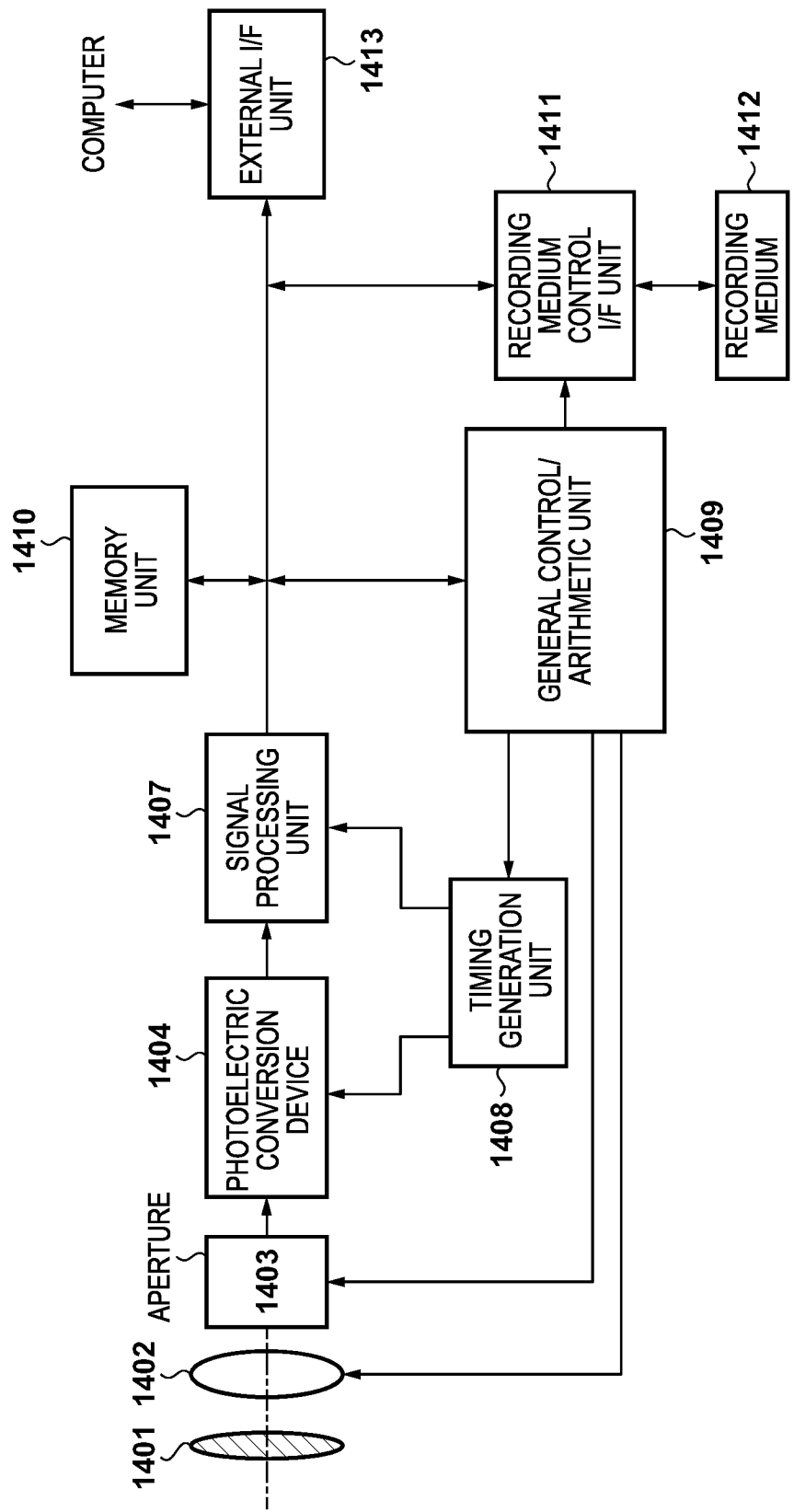
FIG. 15 is a block diagram showing an example of the configuration of an image capturing system incorporating the semiconductor device shown in FIG. 1.

As described above, the semiconductor device 100 according to this embodiment can be applied to a photoelectric conversion device. A photoelectric conversion system using a photoelectric conversion device incorporating the semiconductor device 100 according to this embodiment will be described here with reference to FIG. 15. FIG. 15 is a block diagram showing the schematic configuration of a photoelectric conversion system 1400 according to this embodiment.

The photoelectric conversion device incorporating the semiconductor device 100 can be applied to various kinds of photoelectric conversion systems. Examples of photoelectric conversion systems to which the semiconductor device is applicable are a digital still camera, a digital camcorder, a monitoring camera, a copying machine, a facsimile apparatus, a mobile phone, an in-vehicle camera, and an observation satellite. A camera module including an optical system such as a lens and a photoelectric conversion device is also included in the photoelectric conversion systems. FIG. 15 shows the block diagram of a digital still camera as an example of these.

The photoelectric conversion system 1400 shown in FIG. 15 includes a photoelectric conversion device 1404 incorporating the semiconductor device 100, a lens 1402 that forms an optical image of an object on the photoelectric conversion unit (for example, the photoelectric conversion unit 523 shown in FIG. 5) of the photoelectric conversion device 1404, an aperture 1403 configured to change the amount of light passing through the lens 1402, and a barrier 1401 configured to protect the lens 1402. The lens 1402 and the aperture 1403 form an optical system that condenses light to the photoelectric conversion device 1404. The photoelectric conversion device 1404 converts the optical image formed by the lens 1402 into an electrical signal.

The photoelectric conversion system 1400 also includes a signal processing unit 1407 that is an image generation unit configured to generate an image by processing an output signal output from the photoelectric conversion device 1404. The signal processing unit 1407 performs an operation of performing various kinds of correction and compression as needed, thereby outputting image data. The signal processing unit 1407 may be formed on a semiconductor substrate on which the photoelectric conversion device 1404 is provided or may be formed on a semiconductor substrate different from the photoelectric conversion device 1404. In addition, the photoelectric conversion device 1404 and the signal processing unit 1407 may be formed on the same semiconductor substrate.

The photoelectric conversion system 1400 further includes a memory unit 1410 configured to temporarily store image data, and an external interface unit (external I/F unit) 1413 configured to communicate with an external computer or the like. Also, the photoelectric conversion system 1400 includes a recording medium 1412 such as a semiconductor memory configured to record or read image capturing data, and a recording medium control interface unit (recording medium control I/F unit) 1411 configured to perform record or read for the recording medium 1412. Note that the recording medium 1412 may be incorporated in the photoelectric conversion system 1400 or may be detachable.

Furthermore, the photoelectric conversion system 1400 includes a general control/arithmetic unit 1409 that controls various kinds of operations and the entire digital still camera, and a timing generation unit 1408 that outputs various kinds of timing signals to the photoelectric conversion device 1404 and the signal processing unit 1407. Here, the timing signal and the like may be input from the outside, and the photoelectric conversion system 1400 need only include at least the photoelectric conversion device 1404, and the signal processing unit 1407 that processes an output signal output from the photoelectric conversion device 1404.

The photoelectric conversion device 1404 outputs an image capturing signal to the signal processing unit 1407. The signal processing unit 1407 executes predetermined signal processing for the image capturing signal output from the photoelectric conversion device 1404, and outputs image data. The signal processing unit 1407 generates an image using the image capturing signal.

As described above, according to this embodiment, it is possible to implement the photoelectric conversion system to which the photoelectric conversion device 1404 (for example, an image capturing device) incorporating the above-described semiconductor device 100 is applied.

Figure 16A:
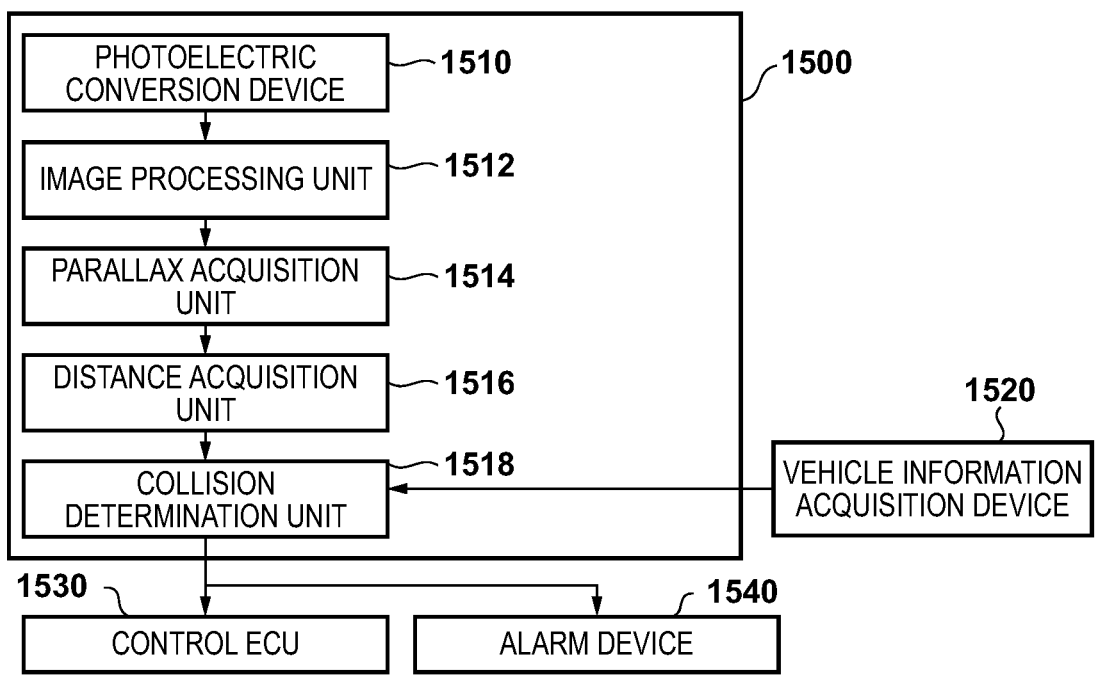
FIGS. 16A and 16B are block diagrams showing an example of the configuration of a transport apparatus including an image capturing system incorporating the semiconductor device shown in FIG. 1.
Figure 16B:
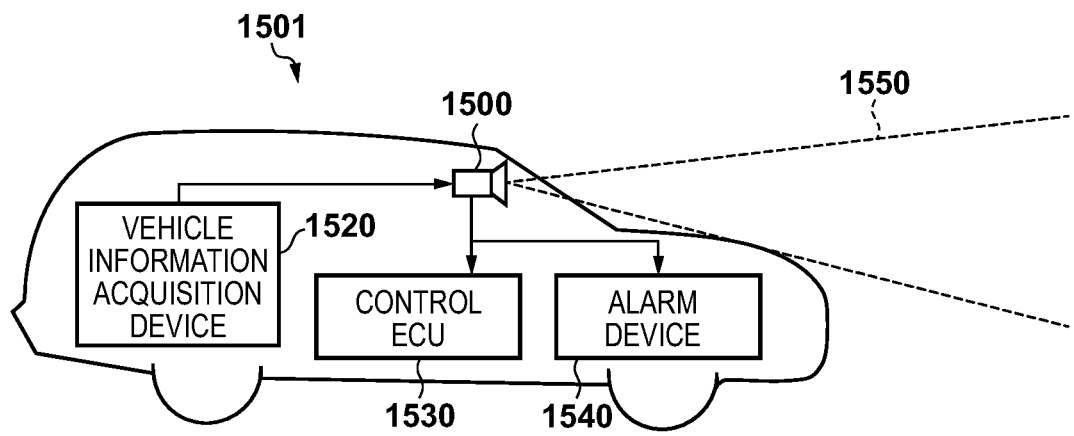

A photoelectric conversion system and a transport apparatus including a photoelectric conversion device incorporating the semiconductor device 100 according to this embodiment will be described next with reference to FIGS. 16A and 16B. FIGS. 16A and 16B are block diagrams showing the configuration of a photoelectric conversion system 1500 incorporating the semiconductor device 100 according to this embodiment and the configuration of a transport apparatus 1501 incorporating the photoelectric conversion system 1500.

FIG. 16A shows an example of the photoelectric conversion system 1500 concerning an in-vehicle camera. The photoelectric conversion system 1500 includes a photoelectric conversion device 1510 incorporating the semiconductor device 100. The photoelectric conversion system 1500 includes an image processing unit 1512 that performs signal processing such as image processing for a plurality of image data acquired by the photoelectric conversion device 1510, and a parallax acquisition unit 1514 that calculates a parallax (the phase difference between parallax images) from the plurality of image data that have undergone the signal processing by the image processing unit 1512. The photoelectric conversion system 1500 also includes a distance acquisition unit 1516 that calculates the distance up to a target based on the calculated parallax, and a collision determination unit 1518 that determines, based on the calculated distance, whether there is collision possibility. Here, the parallax acquisition unit 1514 and the distance acquisition unit 1516 are examples of a distance information acquisition unit that acquires distance information up to a target. That is, the distance information is information concerning a parallax, a defocus amount, a distance up to a target, and the like. The collision determination unit 1518 may determine collision possibility using one of the pieces of distance information. The distance information acquisition unit may be implemented by exclusively designed hardware, or may be implemented by a software module. The distance information acquisition unit may be implemented by an FPGA (Field Programmable Gate Array) or ASIC (Application Specific Integrated Circuit), or may be implemented by a combination of these.

The photoelectric conversion system 1500 is connected to a vehicle information acquisition device 1520 of the transport apparatus 1501 (for example, a vehicle) including a driving device, and can acquire vehicle information such as a vehicle speed, a yaw rate, and a steering angle. The photoelectric conversion system 1500 is also connected to a control ECU 1530 that is a control device configured to output a control signal for generating a braking force to the vehicle based on the determination result of the collision determination unit 1518. Also, the photoelectric conversion system 1500 is connected to an alarm device 1540 that generates an alarm to the driver based on the determination result of the collision determination unit 1518. For example, if collision possibility is high as the determination result of the collision determination unit 1518, the control ECU 1530 performs vehicle control of braking, releasing the accelerator pedal, or suppressing the engine output, thereby avoiding collision and reducing damage. The alarm device 1540 sounds an alarm, displays alarming information on the screen of a car navigation system or the like, applies a vibration to the seat belt or a steering wheel, thereby making an alarm to the user.

In this embodiment, the periphery of the transport apparatus 1501, for example, the front or rear side is captured by the photoelectric conversion system 1500. FIG. 16B shows the photoelectric conversion system 1500 in a case in which the front side (image capturing range 1550) of the transport apparatus 1501 is captured. The vehicle information acquisition device 1520 sends an instruction to the photoelectric conversion system 1500 or the photoelectric conversion device 1510. With this configuration, it is possible to further improve the accuracy of distance measurement.

An example in which driving devices such as the brake, the accelerator, and the engine of the transport apparatus 1501 are controlled based on information obtained by the photoelectric conversion device 1510 so as not to collide with another vehicle has been described. However, the present invention is not limited to this, and the system can also be applied to control of performing automated driving following another vehicle or control of performing automated driving without deviating from a lane. Also, an example in which the photoelectric conversion system 1500 incorporating the semiconductor device 100 is incorporated in the transport apparatus 1501 has been described. However, the semiconductor device 100 may be incorporated in the vehicle information acquisition device 1520, the control ECU 1530, or the alarm device 1540. The photoelectric conversion system 1500 incorporating the semiconductor device 100 can be applied not only to a vehicle such as an automobile but also to, for example, a transport apparatus including a driving device, such as a ship, an airplane, a railroad vehicle, or an industrial robot. In addition, the photoelectric conversion system can be applied not only to a moving body but also to an apparatus that broadly uses object recognition, such as an intelligent transport system (ITS).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-026468, filed Feb. 19, 2020 and Japanese Patent Application No. 2020-192667, filed Nov. 19, 2020 which are hereby incorporated by reference herein in their entirety.

What is claimed is:

1. A semiconductor device comprising an integrated circuit, wherein the integrated circuit comprises:
    a first element configured to execute a predetermined operation;
    a second element; and
    a controller configured to perform control of operating the second element in a case in which a deterioration signal representing performance deterioration of the first element is received and setting the second element in a non-operation state in a case in which the deterioration signal is not received,
    wherein the integrated circuit further includes a monitor circuit configured to monitor a state of the first element,
    wherein the monitor circuit supplies the deterioration signal to the controller in accordance with a degree of the performance deterioration of the first element,
    wherein the monitor circuit includes an oscillation circuit, and
    wherein the monitor circuit supplies the deterioration signal to the controller in accordance with an oscillation frequency of the oscillation circuit.

2. The device according to claim 1, wherein the integrated circuit includes a plurality of second elements,
    the deterioration signal is a multi-valued signal corresponding to the performance deterioration of the first element, and the controller changes the number of second elements to be operated in the plurality of second elements based on the deterioration signal corresponding to the performance deterioration of the first element.

3. The device according to claim 1, wherein the case in which the deterioration signal is not received is a case in which a signal representing that the performance deterioration of the first element is small as compared to a case in which the deterioration signal is generated is received.

4. The device according to claim 1, wherein the integrated circuit further includes a third element, and
the deterioration signal includes a signal representing a state of the third element.

5. The device according to claim 1, wherein the semiconductor device further comprises an external monitor circuit configured to monitor a state of the first element separately from the integrated circuit, and
the external monitor circuit supplies the deterioration signal to the controller in accordance with a degree of the performance deterioration of the first element.

6. The device according to claim 5, wherein the external monitor circuit supplies the deterioration signal to the controller in accordance with at least one of a temperature, an operating voltage, a total current-carrying time, or a toggle rate of the first element.

7. The device according to claim 1, wherein the first element includes a clock buffer configured to constitute a clock tree, and
the second element includes an element configured to function as the clock buffer.

8. The device according to claim 1, wherein the first element includes a power shutdown switch configured to stop power supply to some circuits in the integrated circuit, and
the second element includes an element configured to function as the power shutdown switch.

9. The device according to claim 1, wherein the integrated circuit operates in a plurality of operation modes, and
the controller sets the second element in the non-operation state every time the operation mode switches from a first operation mode to a second operation mode in the plurality of operation modes.

10. The device according to claim 9, wherein the integrated circuit includes a plurality of second elements, and
the controller changes the number of second elements to be operated in the plurality of second elements in accordance with each operation mode in the plurality of operation modes.

11. A photoelectric conversion device comprising:
a semiconductor device defined in claim 1; and
a photoelectric conversion unit in which a plurality of pixels each including a photoelectric conversion element configured to convert incident light into an electrical signal are arranged.

12. The device according to claim 11, wherein a first element includes a driving circuit configured to drive the photoelectric conversion unit, and
a second element includes an element configured to function as the driving circuit.

13. The device according to claim 12, wherein the first element includes an output buffer circuit arranged in the driving circuit, and
the second element includes an element configured to function as the output buffer circuit.

14. The device according to claim 11, wherein the photoelectric conversion device has a stacked structure including a first layer with the photoelectric conversion unit, and a second layer with the integrated circuit.

15. A photoelectric conversion system comprising:
a photoelectric conversion device defined in claim 11;
an optical system configured to form an image on a photoelectric conversion unit of the photoelectric conversion device; and
a signal processing unit configured to process a signal output from the photoelectric conversion device.

16. A transport apparatus comprising a driving device, comprising a control device including a photoelectric conversion device defined in claim 11 and configured to control the driving device based on information obtained by the photoelectric conversion device.

17. A control method of a semiconductor device comprising an integrated circuit including a first element configured to execute a predetermined operation, and a second element, comprising:
operating the second element in a case in which a deterioration signal representing performance deterioration of the first element is received; and
controlling the second element not to operate in a case in which a deterioration signal representing performance deterioration of the first element is not received,
wherein the integrated circuit further includes a monitor circuit configured to monitor a state of the first element,
wherein the monitor circuit supplies the deterioration signal in accordance with a degree of the performance deterioration of the first element,
wherein the monitor circuit includes an oscillation circuit, and
wherein the monitor circuit supplies the deterioration signal in accordance with an oscillation frequency of the oscillation circuit.

* * * * *